United States Patent [19]

Burk, Jr.

[11] Patent Number: 5,788,777
[45] Date of Patent: Aug. 4, 1998

[54] SUSCEPTOR FOR AN EPITAXIAL GROWTH FACTOR

[76] Inventor: Albert A. Burk, Jr., 4123 Windsor Rd., Murrysville, Pa. 15668

[21] Appl. No.: 811,791

[22] Filed: Mar. 6, 1997

[51] Int. Cl.$^6$ ............................................. C23C 16/00
[52] U.S. Cl. ................................. 118/730; 118/500
[58] Field of Search ............................... 118/730, 500

[56] References Cited

U.S. PATENT DOCUMENTS

| | | | |
|---|---|---|---|
| 4,860,687 | 8/1989 | Frijlink | 118/500 |
| 4,961,399 | 10/1990 | Frijlink | 118/730 |
| 5,027,749 | 7/1991 | Frijlink | 118/730 |

OTHER PUBLICATIONS

Frijlink, Journal of Crystal Growth 107(1991) 166–174.

*Primary Examiner*—Richard Bueker
*Attorney, Agent, or Firm*—Walter G. Sutcliff

[57] ABSTRACT

A susceptor assembly for use in an epitaxial growth reactor for growing silicon carbide epitaxial layers. The susceptor assembly is rotatable about a central axis and includes a plurality of cavities each for receiving a wafer holder. A plurality of gas passageways leading to respective cavities, carries gas for levitating and rotating the wafer holders in their respective cavities. All of the gas passageways in the susceptor assembly are non-radially oriented.

8 Claims, 5 Drawing Sheets

SUSCEPTOR FOR AN EPITAXIAL GROWTH FACTOR

BACKGROUND OF THE INVENTION

1. Field of the invention

The invention in general relates to semiconductor epitaxial layer growth, and more particularly to a susceptor for a growth reactor capable of growing silicon carbide semiconductors layers.

2. Description of Related Art

Silicon carbide is being used extensively as a semiconductor material for various electronic applications. Silicon carbide is a wide bandgap semiconductor with desirable material properties including high breakdown field strength 10 times larger, and thermal conductivity 3 times larger than conventional semiconductor materials. Accordingly, semiconductor devices of silicon carbide have the ability to operate at higher voltages and temperatures than conventional silicon or gallium arsenide devices thus providing for higher power devices with reduced cooling requirements that operate from dc to microwave frequencies.

Electronic applications for silicon carbide semiconductor devices include compact, low cost airborne, ship and ground radars, aircraft engine and flight controls, electric tank and ship propulsion systems and satellite communications, to name a few. In the commercial sector, silicon carbide may be used in the field of high definition television, industrial power conditioning, nuclear control and instrumentation and electric vehicle power trains.

In one popular process for the fabrication of a silicon carbide semiconductor device, thin epitaxial layers of silicon carbide are deposited by an epitaxial technique known as vapor phase epitaxy, a special case of the more general chemical vapor deposition. In vapor phase epitaxy the crystal structure and polytype of a relatively thick substrate is reproduced, but with higher purity and crystalline quality than the substrate. In addition, intentional impurity atoms of a dopant are added as desired to produce numerous layers with tailored conductivity and carrier type.

The epitaxial layers are grown in a device known as a reactor. In one well known type of reactor used for growing epitaxial layers of III-V compounds, such as gallium arsenide, a plurality of wafer substrates may be accommodated by a graphite susceptor wherein the wafers are rotated as the susceptor is rotated during the deposition process. Typical reactor temperature during epitaxial deposition is approximately 800° C. To grow epitaxial layers of silicon carbide, however, requires much higher temperatures, in the range of 1450°-1700° C., and at these temperatures cracking of the susceptor has been experienced.

The present invention provides for a susceptor design that will allow for III-V compound epitaxial growth as well as higher temperature silicon carbide epitaxial growth.

SUMMARY OF THE INVENTION

A susceptor for an epitaxial growth reactor in accordance with the present invention includes a circular susceptor assembly of radius R. A plurality of gas passageways are defined in the susceptor assembly, with the susceptor assembly having only gas passageways which are non-radially oriented.

In one embodiment the susceptor assembly has a central aperture and is rotatable about a central axis. The susceptor assembly includes a plurality of cavities defined therein each for receiving a wafer holder which is rotatable within the cavity. A plurality of gas passageways are defined in the susceptor assembly each being on a non-radial line which extends from the central aperture to the vicinity of a respective cavity and is in gas communication therewith in a manner that when gas is introduced into the passageways, the gas will impinge upon the wafer holders to rotate them in their cavities.

DESCRIPTION OF THE PREFERRED EMBODIMENT

Figure 1:
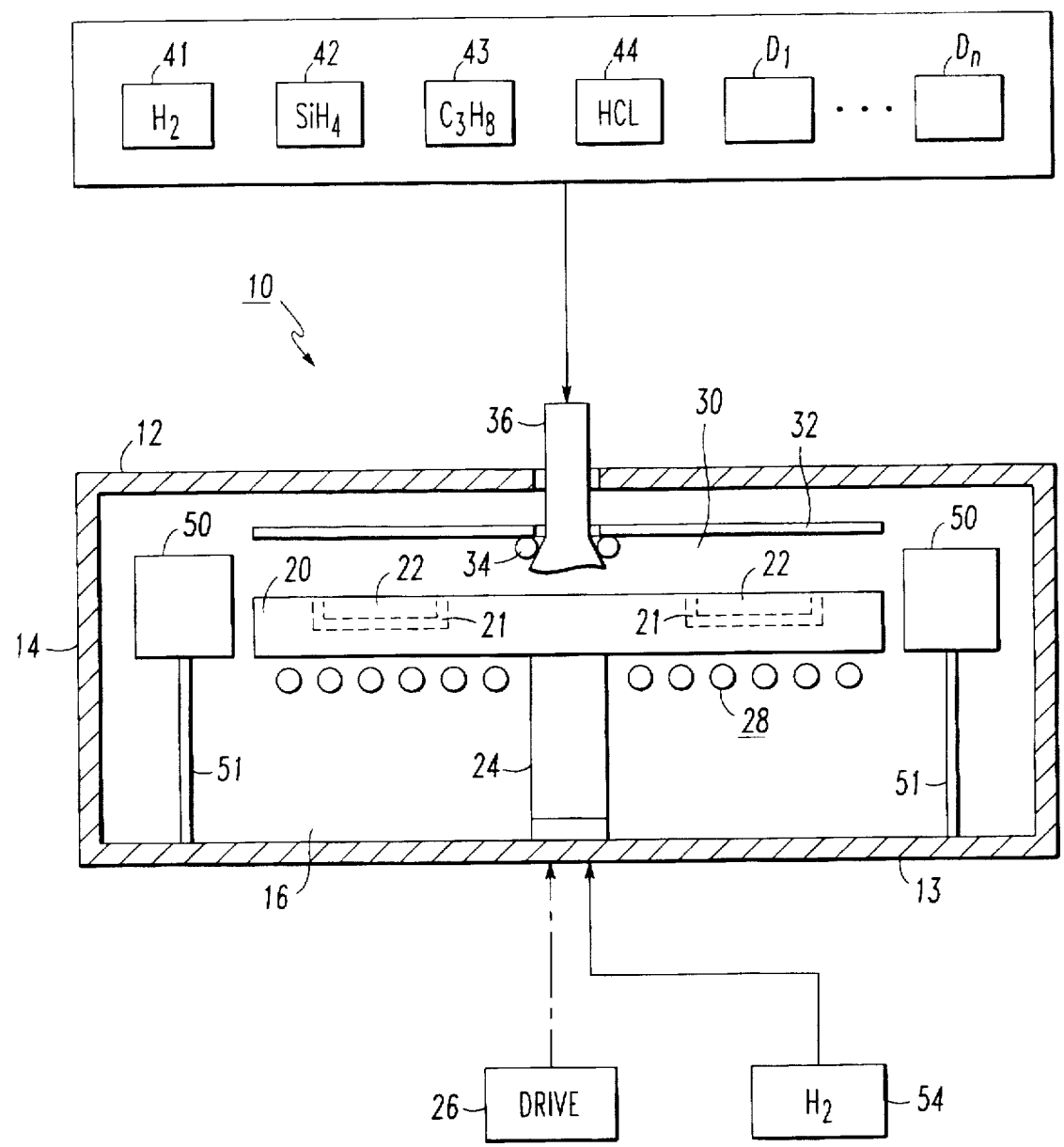
FIG. 1 is a schematic illustration of a vapor phase epitaxial growth reactor.

In FIG. 1 there is illustrated a vapor phase epitaxial growth reactor 10 having a top 12, a bottom 13 and side wall portions 14, to define an interior chamber 16. Disposed within the chamber 16 is a susceptor assembly 20 having a plurality of cavities 21 therein each for accommodating a respective wafer holder 22.

The susceptor assembly is coupled to, and rotated by, a support 24 which is rotatable about a central axis by means of a drive mechanism 26, located outside of the chamber 16. Disposed below the susceptor assembly 20 is a heat source such as an r.f. heating coil arrangement 28 operable to establish the required temperature for silicon carbide growth within a reaction zone 30.

The reaction zone 30 is located between the upper surface of the susceptor assembly and a reaction zone ceiling 32, maintained in position by means of a ceiling ring 34. Passing through the ceiling 30 and ring 34 is a nozzle 36 for supplying various gases utilized in the growth process.

These gases are provided by a gas supply 40 and may include, by way of example for silicon carbide epitaxial growth, a carrier gas 41 such as hydrogen, a source of silicon such as silane 42, a source of carbon such as propane 43, an etchant such as hydrogen chloride 44, and various dopant gases D1 to Dn.

The various gases provided to the reaction zone 30 are thereafter removed by means of an annular gas collector 50 which discharges the spent gases through conduits 51 to a location outside of the chamber 16.

During the deposition process, and as will be explained, the susceptor assembly rotates by virtue of its coupling to rotatable support 24 and during this rotation a levitating gas, such as hydrogen, from source 54 is supplied through support 24 to gas passageways within the susceptor assembly 20 to cause rotation of the individual wafer holders 22.

Figure 2:
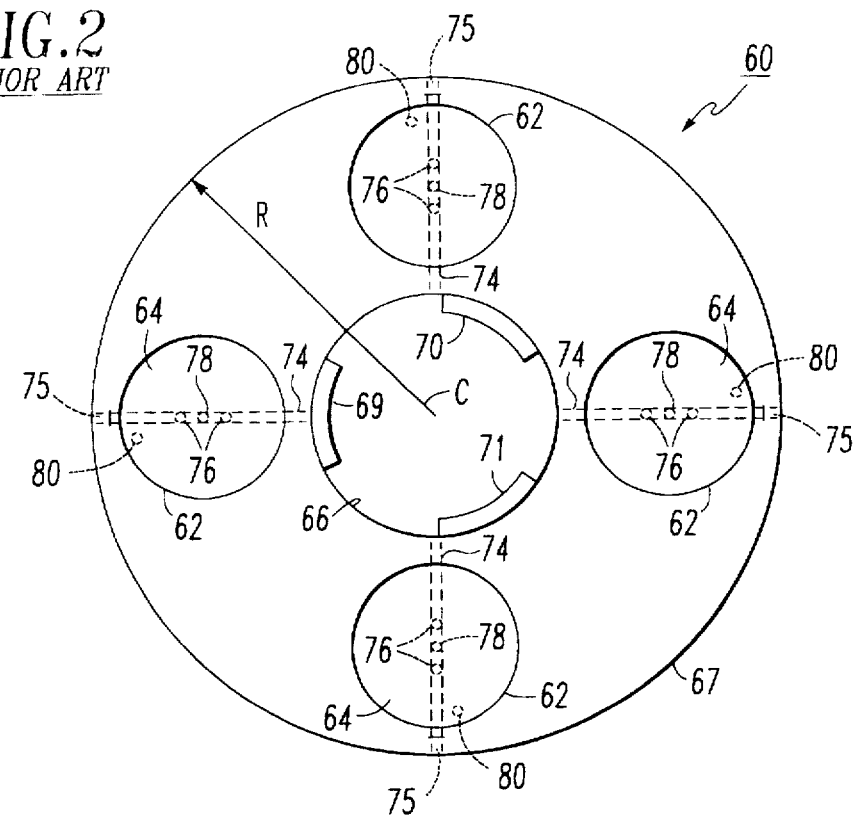
FIG. 2 is a plan view of a susceptor of the prior art.
Figure 3:
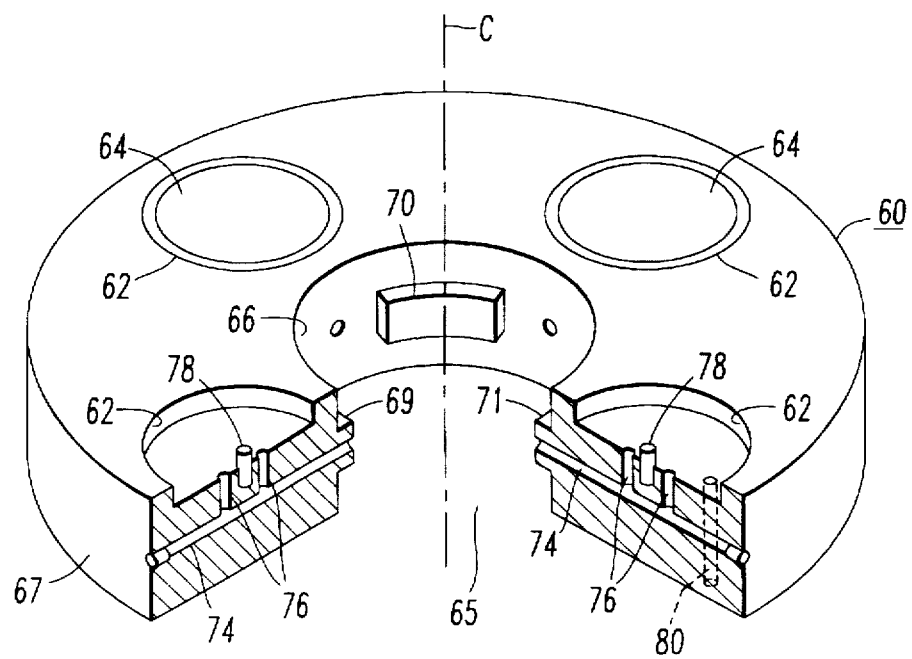
FIG. 3 is an isometric view, with a portion broken away, of the susceptor of FIG. 2.

FIG. 2 illustrates a plan view of a typical susceptor assembly suitable for epitaxial growth of III-V compounds, and FIG. 3 illustrates an isometric view, with a quadrant removed. The circular susceptor assembly 60, of radius R, is symmetrically arranged about a central longitudinal axis C, and includes a plurality of cavities 62 defined in the upper surface thereof for receiving respective wafer holders 64. FIG. 3 shows two of the cavities with the wafer holders removed, and although four cavities are illustrated by way of example, more or fewer cavities can be utilized.

The susceptor assembly is in the form of a ring having a central aperture 65, as well as an inner peripheral wall surface 66 and an outer peripheral wall surface 67. A series of flange segments 69, 70 and 71 are arranged on the inner surface 66 for connection to a rotatable support such as illustrated in FIG. 1.

Gas passageways 74 are formed within the body of susceptor assembly 60 for conducting gas, introduced at the central aperture 65, to the cavities 64 in order to levitate and cause the wafer holders to rotate as the susceptor assembly 60 rotates. This planetary rotation arrangement results in improved epitaxial layer thickness and doping uniformity. The gas passageways 74 may be formed such as by drilling. If the central aperture 65 is large enough the drilling may proceed from the inner surface 66 along a radial line to a cavity 62. Alternatively, and as illustrated in FIG. 2, the drilling may commence at the outer surface 67 to the inner surface 66, with the end of each passageway 74 being sealed as indicated by numeral 75.

Vertical channels 76 (best seen in FIG. 3) then conduct the gas within passageway 74 to the underside of a respective wafer holder 64 to levitate the wafer holder 64 relative to a central post 78, such as of molybdenum, and to rotate the wafer holder. Gas may then be exhausted from the cavity 62 by means of an output vertical channel 80.

A typical susceptor assembly 60 is made of graphite and is heated to temperatures of 800° C. max. for III-V compounds and to 1200° C. max. for silicon. For growth of silicon carbide epitaxial layers, however, temperatures of approximately 1450°-1700° C. are required and at these temperatures the described susceptor assembly 60 is prone to cracking. In particular, cracking is initiated at the inner surface 66 and propagates along a radially oriented gas passageway 74 to the outer surface 67. The problem is compounded if the radial passageway is contiguous with a vertical corner of a flange segment 69, 70 or 71.

The cracking problem is due to the fact that the susceptor assembly is non-uniformly heated. The temperature at the inner surface 66 is cooler than the rest of the susceptor assembly with temperature increasing with increasing radius until near the outer surface 67, where the temperature is reduced somewhat, but not to that of the inner surface 66. This temperature non-uniformity causes large compressive and tension forces. In view of the fact that graphite's compressive strength of ~250 Mpa is approximately 5 times higher than its tensile strength of ~50 Mpa, it can crack at the cooler inside diameter, particularly along a weakened section of material such as the gas passageways 74, or a discontinuity such as the vertical corner of a flange segment. These geometrical features multiply the tension forces by factors of approximately 3 each.

Figure 4:
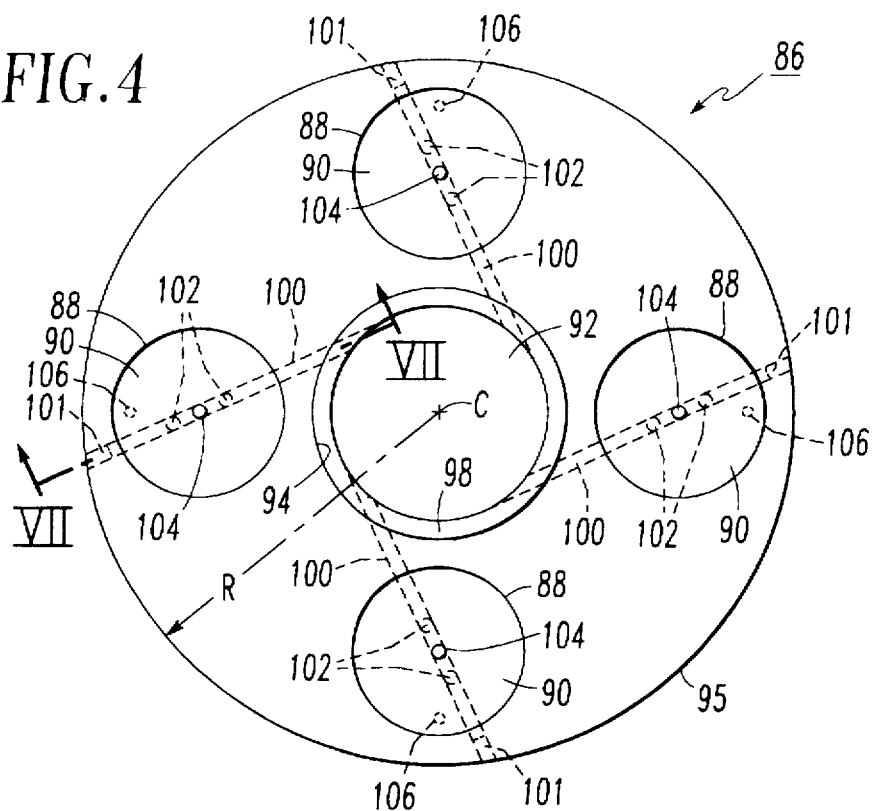
FIG. 4 is a plan view of one embodiment of a susceptor in accordance with the present invention.
Figure 5:
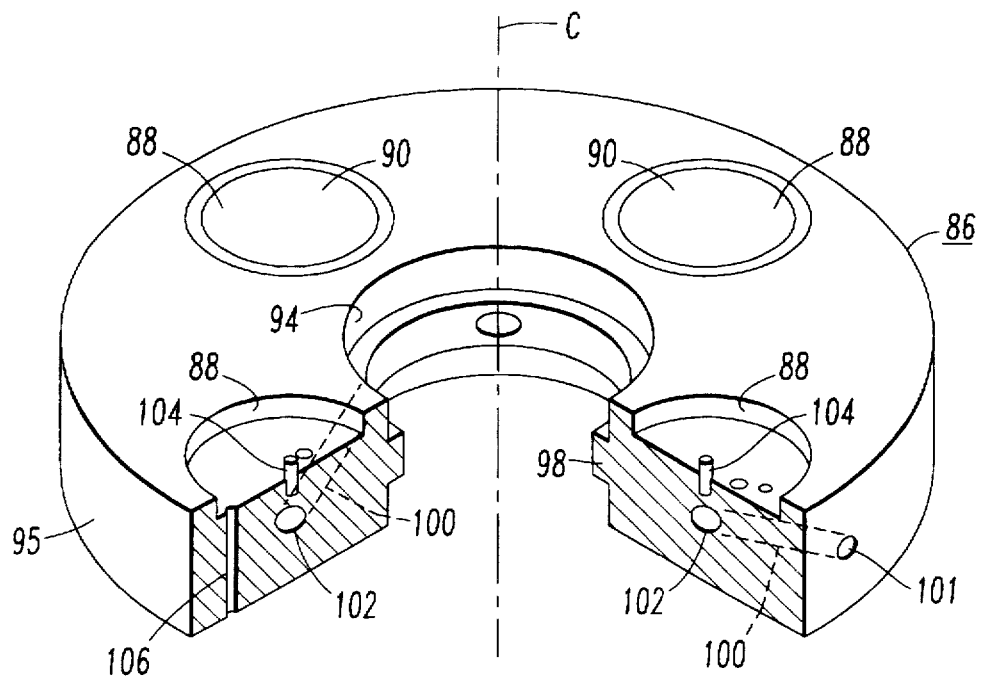
FIG. 5 is an isometric view, with a portion broken away, of the susceptor of FIG. 3

The present invention obviates these problems and allows the epitaxial growth of silicon carbide at elevated temperatures, and to this end reference is made to FIG. 4 showing a plan view of an improved susceptor assembly, and to FIG. 5 showing an isometric view, with a quadrant removed.

The susceptor assembly 86, like that of FIG. 2, includes a plurality of cavities 88 each for receiving a respective wafer holder 90. The susceptor assembly 86, in one embodiment, is in the form of a circular ring of radius R having a central aperture 92, as well as an inner peripheral surface 94 and an outer peripheral surface 95. In the embodiment of the invention illustrated in FIGS. 4 and 5, a continuous uninterrupted flange 98 is provided around the central axis C, on the inner surface 94 for connection to a rotating support, thereby eliminating vertical corners, and therefore, stress concentrations associated therewith.

The susceptor assembly 86, which may be made of graphite, silicon carbide, or silicon carbide coated graphite, to name a few, includes a plurality of non-radial gas passageways 100 which may be formed by drilling from the outside surface 95 to the inside surface 94, in which case the outer end of the passageway is sealed, as indicated by numeral 101. Gas, introduced at the central aperture 92 is provided to each cavity 88 via a respective gas passageway 100 and vertical gas channels 106 to levitate the wafer holder 90 relative to a central post 104 and to rotate the wafer holder. Gas may then be exhausted from the cavity 88 by means of an output vertical channel 106. For epitaxial growth of silicon carbide it is preferable that the post 104 be made from tantalum, as opposed to molybdenum, so that it will not swell and seize within the wafer holder 90 as a result of the high temperatures and reactants utilized.

In accordance with the present invention, the design of the susceptor assembly 86 includes only non-radially oriented gas passageways. Although the gas passageways do provide a weakened structure along which a crack or cracks may propagate, the tension forces, with the present design tending to separate the structure are significantly less than with radially oriented passageways. The non-radial orientation of the passageways resists cracking in the presence of the elevated temperatures encountered with silicon carbide epitaxial growth. This may be demonstrated with respect to FIGS. 6A and 6B.

Figure 6A:
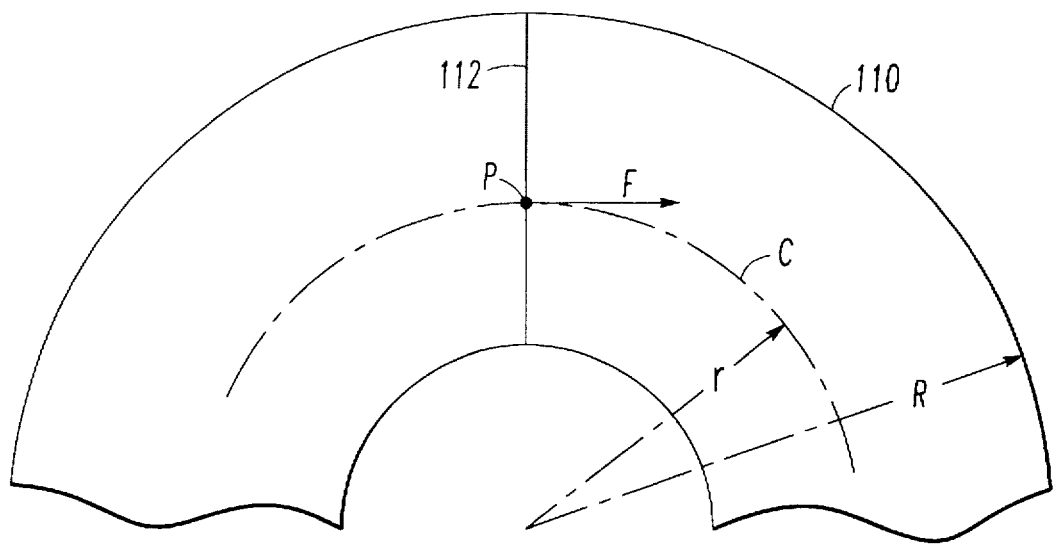
FIGS. 6A and 6B serve to illustrate the tension forces acting on a susceptor.

FIG. 6A illustrates a section of a circular susceptor assembly 110 of radius R, and numeral 112 represents a radial line along which a gas passageway is formed. A circle c, having a radius r, represents any circle on the susceptor assembly 110 and intersects the radial line 112 at point P. Due to the elevated temperatures used in silicon carbide growth and due to temperature nonuniformity, a differential thermal expansion occurs, applying a resultant tension force F, at all points P along line 112, and which force is tangent to any circle c, and perpendicular to line 112. The radial gas passageway coincident with line 112 represents a weakened section and provides a propagating path for a crack as a result of the tension forces.

Figure 6B:
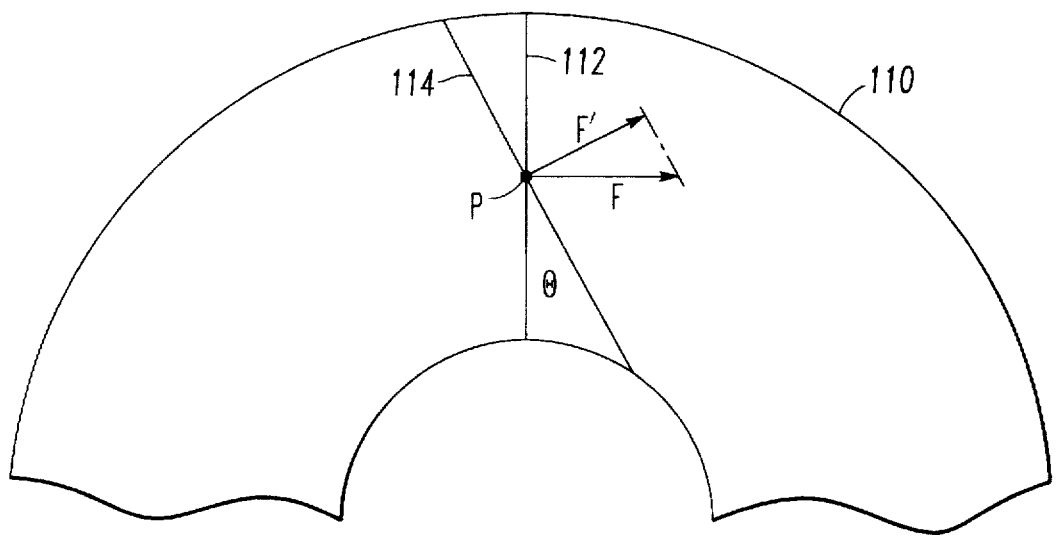

FIG. 6B illustrates the susceptor assembly 110 of FIG. 6A with a non-radial line 114 along which a gas passageway is formed, in accordance with the present invention. Non-radial line 114 lies at an angle θ with respect to radial line 112 and at any point P, force F, which is perpendicular to line 112, is acting to rupture the susceptor assembly 110 along the discontinuity. The tension force F' at point P is perpendicular to line 114 and is of insufficient magnitude to cause a crack propagation along line 114. This is due to the fact that force F' is smaller than the force F by some factor related to the angle. That is, F'=F cos θ, so that the larger the relative angle between the radial and non-radial lines, the less will be the tension force operating on a discontinuity lying along line 114.

Figure 7:
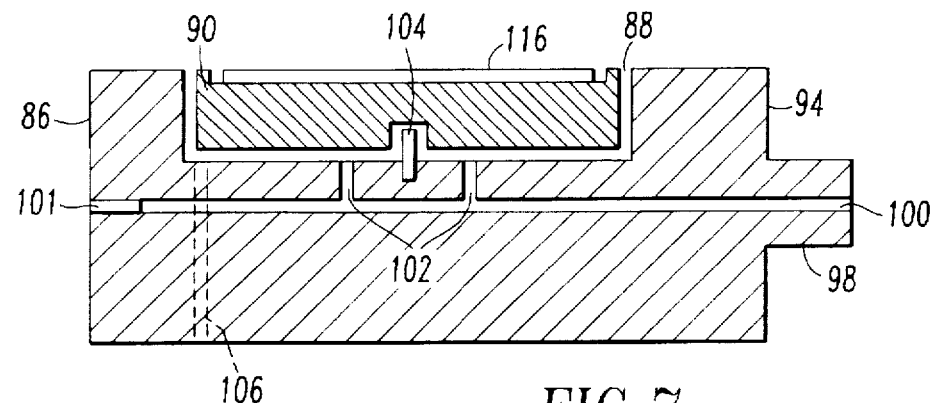
FIG. 7 is a view along line 7—7 of FIG. 4.

The susceptor assembly 86 illustrated in FIGS. 4 and 5 includes a plurality of gas passageways 100 which pass under a respective cavity 88 and delivers gas via vertical channels 102. FIG. 7, which is a view along line 7—7 of FIG. 4 shows the arrangement. In addition, FIG. 7 illustrates a wafer 116 positioned on the wafer holder 90.

Figure 7A:
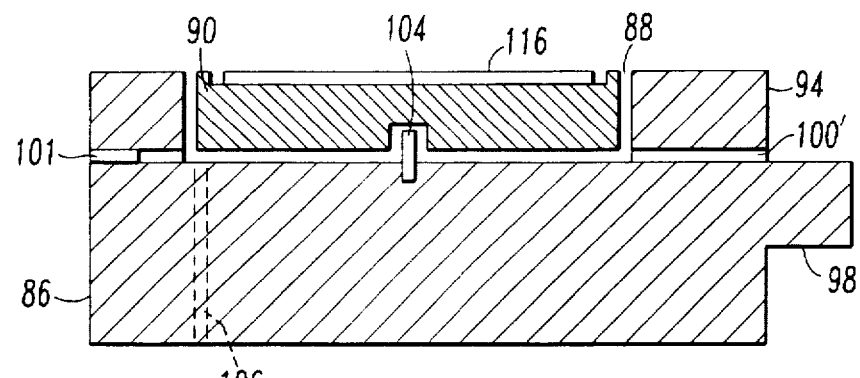
FIGS. 7A and 7B are similar views serving to illustrate different embodiments of gas communication with a susceptor cavity.
Figure 7B:
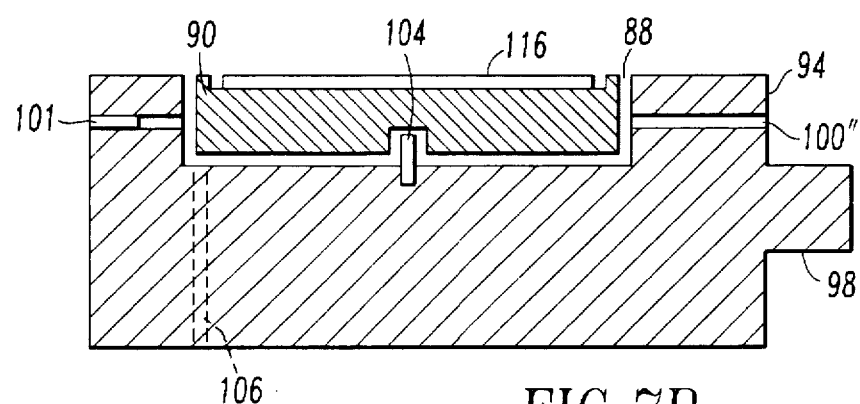

As a variation, FIG. 7A illustrates a gas passageway 100' which enters the cavity 88 near the bottom thereof and communicates with the central aperture just above flange 98. In FIG. 7B the gas passageway 100" is part way up the inner surface 94, above the flange 98. For these latter two embodiments, vanes, or other protuberances may be added to the wafer holders, if desired, at the bottom or side, to aid in the rotation process.

Although the invention has been described with a certain degree of particularity, it will be understood that various modifications and variations may be made without departing from the spirit and scope of the invention, as defined by the following claims.

What is claimed is:

1. In an epitaxial growth reactor, the improvement comprising:
   (A) a circular susceptor assembly of radius R;
   (B) a plurality of gas passageways defined in said susceptor assembly;
   (C) said susceptor assembly having only gas passageways which are non-radially oriented.

2. Apparatus according to claim 1 wherein:
   (A) said susceptor assembly has a central portion; and
   (B) said gas is introduced into said passageways via said central portion.

3. Apparatus according to claim 1 wherein:
   (A) said susceptor assembly is subjected to temperatures in the range for epitaxial growth of silicon carbide.

4. In an epitaxial growth reactor, the improvement comprising:
   (A) a circular susceptor assembly of radius R, having a central aperture and rotatable about a central axis;
   (B) said susceptor assembly having a plurality of cavities therein;
   (C) a plurality of semiconductor wafer holders each disposed and rotatable in, a respective one of said cavities;
   (D) a plurality of gas passageways in said susceptor assembly each said passageway being on a non-radial line extending from said central aperture to the vicinity of a respective one of said cavities and being in gas communication therewith in a manner that when gas is introduced into said passageways, the gas will impinge upon said wafer holders to rotate them in their cavities.

5. Apparatus according to claim 4 wherein:
   (A) said gas is introduced into said passageways via said central aperture.

6. Apparatus according to claim 4 wherein:
   (A) said susceptor assembly is subjected to temperatures in the range for epitaxial growth of silicon carbide.

7. Apparatus according to claim 4 wherein:
   (A) said susceptor assembly includes an inner peripheral surface defining said central aperture; and which includes,
   (B) a continuous uninterrupted flange member on said inner surface, for making connection to a support.

8. Apparatus according to claim 6 wherein:
   (A) a said cavity includes a central post around which said wafer holder rotates;
   (B) said post being of tantalum.

* * * * *